(12) United States Patent
Joung

(10) Patent No.: US 8,242,514 B2
(45) Date of Patent: Aug. 14, 2012

(54) SEMICONDUCTOR LIGHT EMITTING DIODE

(75) Inventor: Il-Kweon Joung, Seongnam-si (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 186 days.

(21) Appl. No.: 12/634,120

(22) Filed: Dec. 9, 2009

(65) Prior Publication Data
US 2010/0140647 A1    Jun. 10, 2010

(30) Foreign Application Priority Data
Dec. 9, 2008    (KR) .................. 10-2008-0124903

(51) Int. Cl.
*H01L 33/00*    (2010.01)
(52) U.S. Cl. .......................................... 257/79; 257/91
(58) Field of Classification Search .................. 438/107, 438/113; 216/24; 257/79, 91, 95, 98, E33.063, 257/E33.065, E33.005
See application file for complete search history.

(56) References Cited

U.S. PATENT DOCUMENTS
7,462,869 B2 * 12/2008 Ohashi et al. .................. 257/79

FOREIGN PATENT DOCUMENTS
JP    2004-006662 A    1/2004
KR    10-2005-0049730 A    5/2005

OTHER PUBLICATIONS
Korean Office Action, with English translation, issued in Korean Patent Application No. 10-2008-0124903, dated Sep. 7, 2011.

* cited by examiner

*Primary Examiner* — Roy Potter
(74) *Attorney, Agent, or Firm* — McDermott Will & Emery LLP

(57) ABSTRACT

A semiconductor LED and a method manufacturing the semiconductor LED are disclosed. The method can include: forming a light emitting structure, which includes an N-type semiconductor layer, an active layer, and a P-type semiconductor layer stacked together, on a substrate; processing a division groove in the shape of a dotted line from the direction of the substrate or from the direction of the light emitting structure; and dividing the substrate and the light emitting structure along the division groove by applying pressure to at least one of the substrate and the light emitting structure. Embodiments of the invention can prevent total reflection for light emitted through the sides, and as a result, the light emitting efficiency can be improved.

8 Claims, 6 Drawing Sheets

SEMICONDUCTOR LIGHT EMITTING DIODE

CROSS-REFERENCE TO RELATED APPLICATIONS

This application claims the benefit of Korean Patent Application No. 10-2008-0124903, filed with the Korean Intellectual Property Office on Dec. 9, 2008, the disclosure of which is incorporated herein by reference in its entirety.

BACKGROUND

1. Technical Field

The present invention relates to a semiconductor light emitting diode and to a method of manufacturing the semiconductor light emitting diode.

2. Description of the Related Art

Nitrides of group-III elements, such as gallium nitride (GaN), aluminum nitride (AlN), etc., exhibit high thermal stability and provide a direct transition type energy band structure, and are hence commonly used as materials in photoelectric elements for blue and ultraviolet light. In particular, blue and green light emitting diodes (LEDs) that use gallium nitride (GaN) are utilized in a variety of applications, examples of which include large flat panel displays, traffic lights, indoor lighting, high-density light sources, high-resolution output systems, and optical communication.

The structure of a nitride semiconductor LED may include a substrate, a buffer layer, a P-type semiconductor layer, an active layer, an N-type semiconductor layer, and electrodes. The active layer, where the recombination of electrons and electron holes may occur, can include quantum well layers, expressed by the formula $In_xGa_{1-x}N$ ($0 \leq x \leq 1$), and quantum barrier layers. The wavelength of the light emitted from the LED may be determined by the type of material forming the active layer.

A brief description of a semiconductor LED based on the related art is provided as follows, with reference to FIGS. 1 and 2, which illustrate a method of manufacturing a semiconductor LED according to the related art.

As depicted in FIGS. 1 and 2, a semiconductor LED according to the related art may be composed of a sapphire substrate 1, for growing a GaN-based semiconductor material, as well as an N-type semiconductor layer 2, an active layer 3, and a P-type semiconductor layer 4, which are formed in the said order on the sapphire substrate 1. Portions of the P-type semiconductor layer 4 and active layer 3 may be removed, for example, by using a mesa etching process, to form a structure exposing portions of the upper surface of the N-type semiconductor layer 2.

A transparent electrode (see 60 in FIG. 4) and a P-type electrode (see 70 in FIG. 4) may be formed on the P-type semiconductor layer 4, while an N-type electrode (see 30 in FIG. 4) may be formed on the N-type semiconductor layer 2 exposed through the mesa etching process. This structure can be formed by growing the N-type semiconductor layer 2, active layer 3, and P-type semiconductor layer 4 sequentially on the substrate 1.

The structure described above can be implemented as a bulk-type substrate 1, which can be later divided into several unit LEDs. To facilitate the dividing process, division grooves 1a may be formed on one side of the substrate 1, as illustrated in FIG. 2. The process of forming such grooves 1a may be referred to as chip scribing. A typical chip scribing process may be performed using, for example, diamond. Afterwards, the chip can be divided, for example, by way of a breaking process, in which pressure is applied to divide the substrate 1. By dividing the chip through a breaking process after forming the division grooves 1a in straight lines across the substrate 1, the sides of the divided chips may have very little roughness, as illustrated in FIG. 3.

Thus, as illustrated in FIG. 3, total reflection may occur for certain ranges of light, due to the difference in refractivity between the inside and the outside of the chip and the incident angle of the light, so that some of the light emitted from the active layer 3 may not be emitted to the outside of the chip. That is, the total internal reflection within the chip may lower the light-emitting efficiency of the semiconductor LED. As such, a smooth section having little roughness may lower the light-emitting efficiency.

SUMMARY

Certain aspects of the invention provide a semiconductor light emitting diode, and a method of manufacturing the semiconductor light emitting diode, that can improve light-emitting efficiency.

One aspect of the invention provides a semiconductor light emitting diode that includes a light emitting structure. The light emitting structure can include an N-type semiconductor layer, an active layer, and a P-type semiconductor layer stacked together. Here, a first region and a second region having different surface roughness can be formed repeatedly on at least one side of the light emitting structure.

In certain embodiments, the semiconductor LED can further include a substrate stacked on a lower surface of the N-type semiconductor layer, where the first region and the second region can also be formed repeatedly on at least one side of the substrate.

The shape of the light emitting structure may be such that has a portion removed by mesa etching, starting from the P-type semiconductor layer and ending at a point within the N-type semiconductor layer.

Another aspect of the invention provides a method of manufacturing a semiconductor light emitting diode. The method can include: forming on a substrate a light emitting structure, which includes an N-type semiconductor layer, an active layer, and a P-type semiconductor layer stacked together; processing a division groove in the shape of a dotted line from the direction of the substrate or from the direction of the light emitting structure; and dividing the substrate and the light emitting structure along the division groove by applying pressure to at least one of the substrate and the light emitting structure. In certain embodiments, processing the division groove can be performed using laser.

Additional aspects and advantages of the present invention will be set forth in part in the description which follows, and in part will be obvious from the description, or may be learned by practice of the invention.

DETAILED DESCRIPTION

Figure 1:
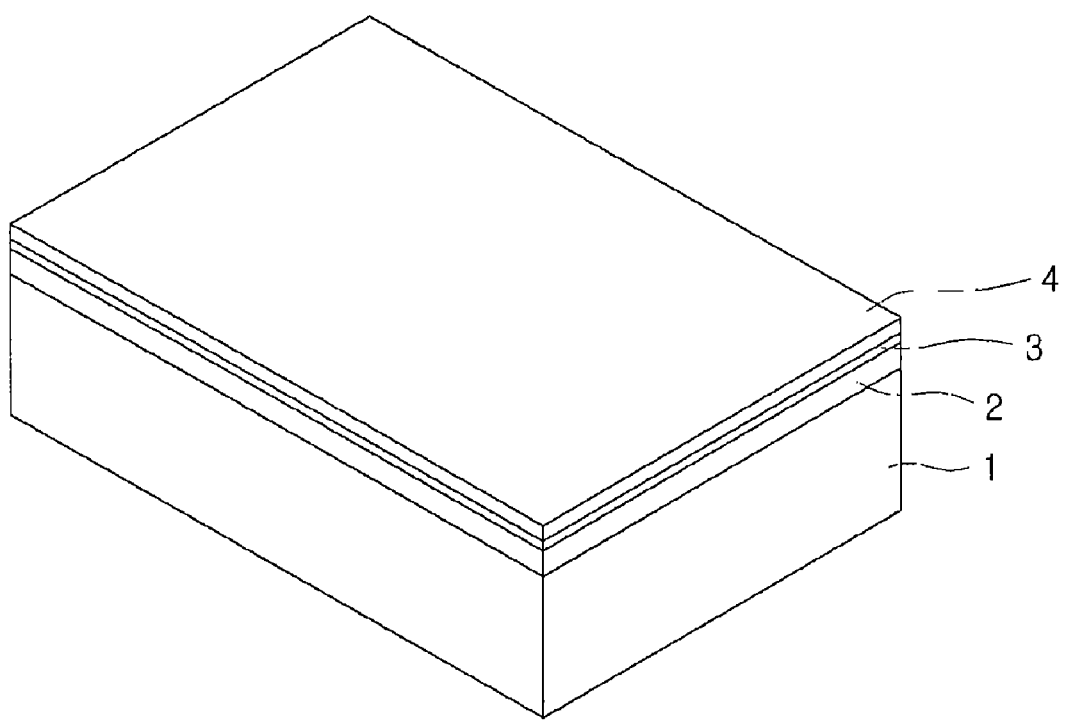
FIG. 1 and FIG. 2 illustrate a method of manufacturing a semiconductor light emitting diode according to the related art.
Figure 2:
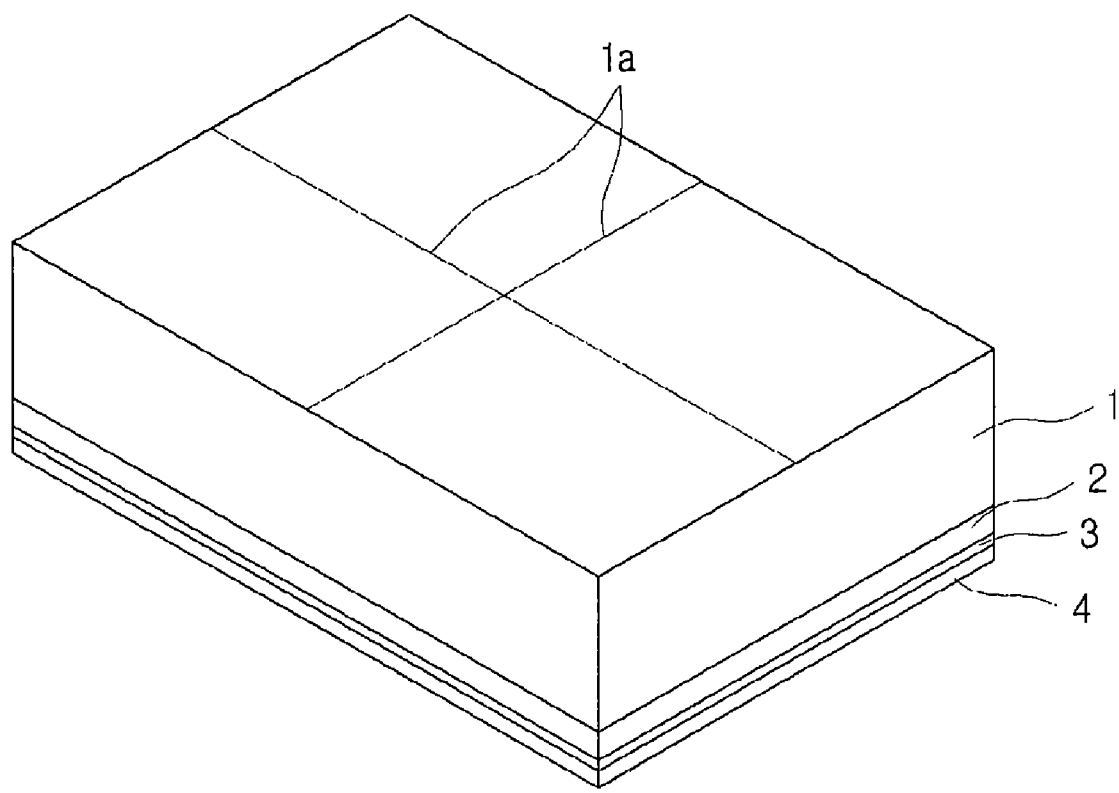
Figure 3:
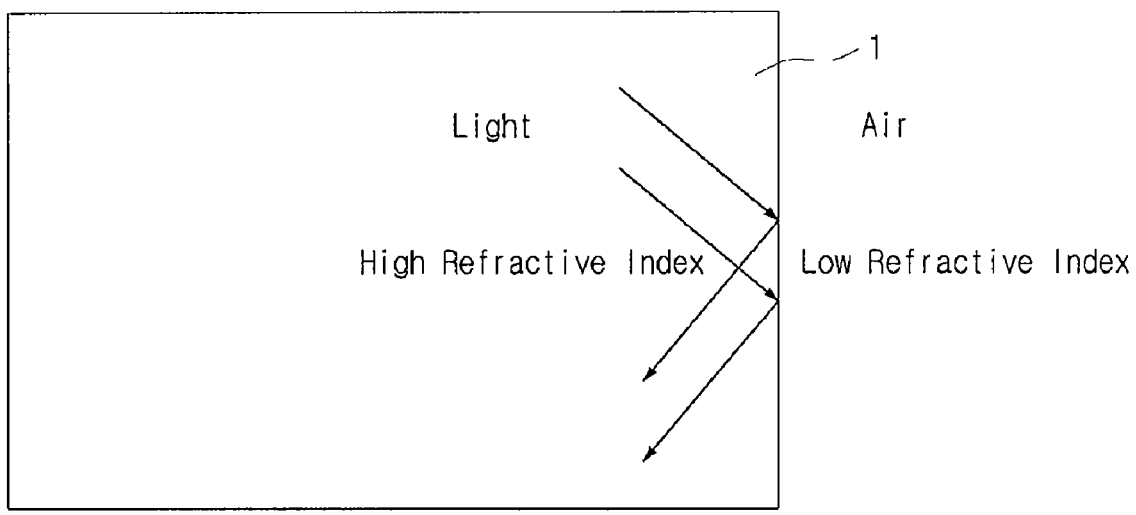
FIG. 3 illustrates how total reflection occurs within a semiconductor light emitting diode based on the related art.

As the invention allows, for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

The semiconductor light emitting diode and the method of manufacturing a semiconductor light emitting diode according to certain embodiments of the invention will be described below in more detail with reference to the accompanying drawings. Those elements that are the same or are in correspondence are rendered the same reference numeral regardless of the figure number, and redundant descriptions are omitted.

Figure 4:
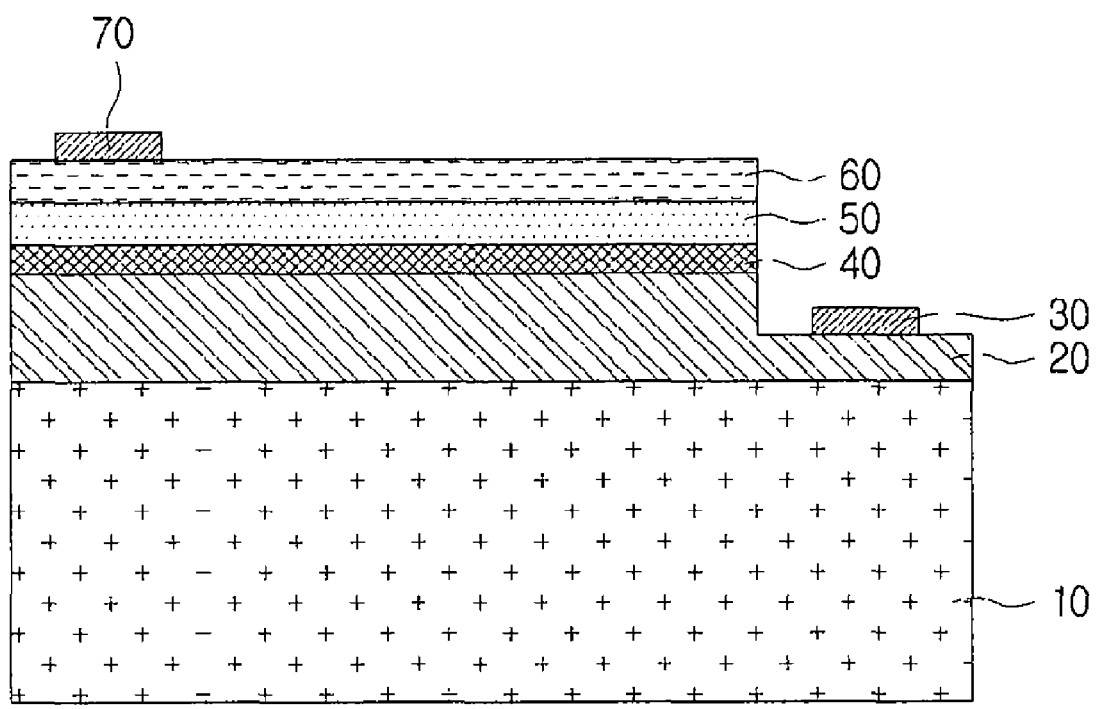
FIG. 4 is a cross-sectional view of a semiconductor light emitting diode based on an aspect of the invention.

FIG. 4 is a cross-sectional view of a semiconductor light emitting diode based on an aspect of the invention. Illustrated in FIG. 4 are a substrate 10, an N-type semiconductor layer 20, an N-type electrode 30, an active layer 40, a P-type semiconductor layer 50, a transparent electrode 60, and a P-type electrode 70.

As illustrated in FIG. 4, a nitride semiconductor LED based on an embodiment of the invention may include a substrate 10, and an N-type semiconductor layer 20, an active layer 40, and a P-type semiconductor layer 50, which are formed in the said order on the substrate 10. Portions of the P-type semiconductor layer 50 and active layer 40 can be removed, using a mesa etching process, for example, to form a structure exposing a portion of the upper surface of the N-type semiconductor layer 20.

An N-type electrode 30 can be formed on the exposed portion of the N-type semiconductor layer 20. Also, a transparent electrode 60 made of ITO (indium-tin oxide), etc., can be formed on the P-type semiconductor layer 50, and a P-type electrode 70 can be formed on the transparent electrode 60.

The substrate 10 can be made from a material suitable for growing nitride semiconductor monocrystals. For example, the substrate 10 may be formed using a material such as sapphire, as well as zinc oxide (ZnO), gallium nitride (GaN), silicon carbide (SiC), aluminum nitride (AlN), etc.

While it is not illustrated in the drawings, a buffer layer can also be formed on the upper surface of the substrate 10, to reduce the difference in lattice constants between the substrate 10 and the N-type semiconductor layer 20, which will be described later in greater detail. The buffer layer (not shown) can be made from a material such as GaN, AlN, AlGaN, InGaN, AlGaInN, etc., or can be omitted depending on the properties of the diode and the conditions for processing.

The N-type semiconductor layer 20 can be formed on the upper surface of the substrate 10 (or the buffer layer). The N-type semiconductor layer 20 can be made from a gallium nitride (GaN)-based material, and can be doped with silicon to lower the operating voltage.

The active layer 40, which may include a quantum well layer (not shown) and a quantum barrier layer (not shown), can be formed on the N-type semiconductor layer 20. The numbers of quantum well layers and quantum barrier layers, which implement a quantum well structure, may vary according to design requirements.

The P-type semiconductor layer 50 can be formed on the active layer 40. The P-type semiconductor layer 50 may be a semiconductor layer doped with P-type conductive impurities, such as Mg, Zn, Be, etc. The P-type semiconductor layer 50 may also be composed of a P-type AlGaN layer (not shown), formed adjacent to the light-emitting region to serve as an electron-blocking layer (EBL), and a P-type GaN layer (not shown), formed adjacent to the P-type AlGaN layer.

In this disclosure, the N-type semiconductor layer 20, active layer 40, and P-type semiconductor layer 50 will be referred to collectively as a light emitting structure. Such a light emitting structure can be formed by growing the N-type semiconductor layer 20, active layer 40, and P-type semiconductor layer 50 in the said order on the substrate 10 (or buffer layer).

Figure 6:
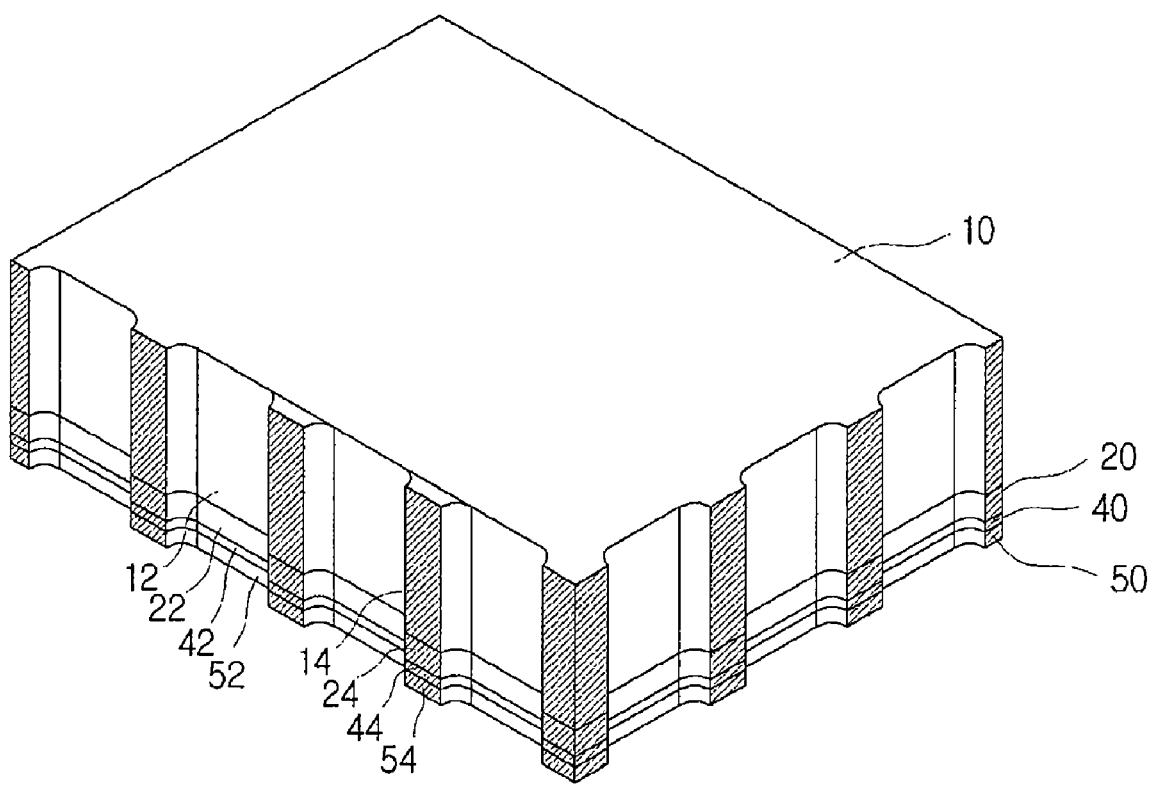
FIG. 6 is a perspective view of a semiconductor light emitting diode based on an aspect of the invention.

As illustrated in FIG. 6, a first region 22, 42, 52 and a second region 24, 44, 54 having different surface roughness can be formed repeatedly over at least one side surface of the light emitting structure. In certain embodiments, for example, the first region 22, 42, 52 can be very smooth and have very low level of surface roughness, while the second region 24, 44, 54 can have a relatively higher level of surface roughness. With the smooth first region 22, 42, 52 and the rougher second region 24, 44, 54 formed repeatedly along the side of the light emitting structure, the rough second region 24, 44, 54 can minimize the occurrence of total reflection for the light emitted from the active layer when the light is emitted through the side of the semiconductor LED, so that there can be a greater amount of light emitted to the outside. In this way, the light efficiency can be improved.

Figure 5:
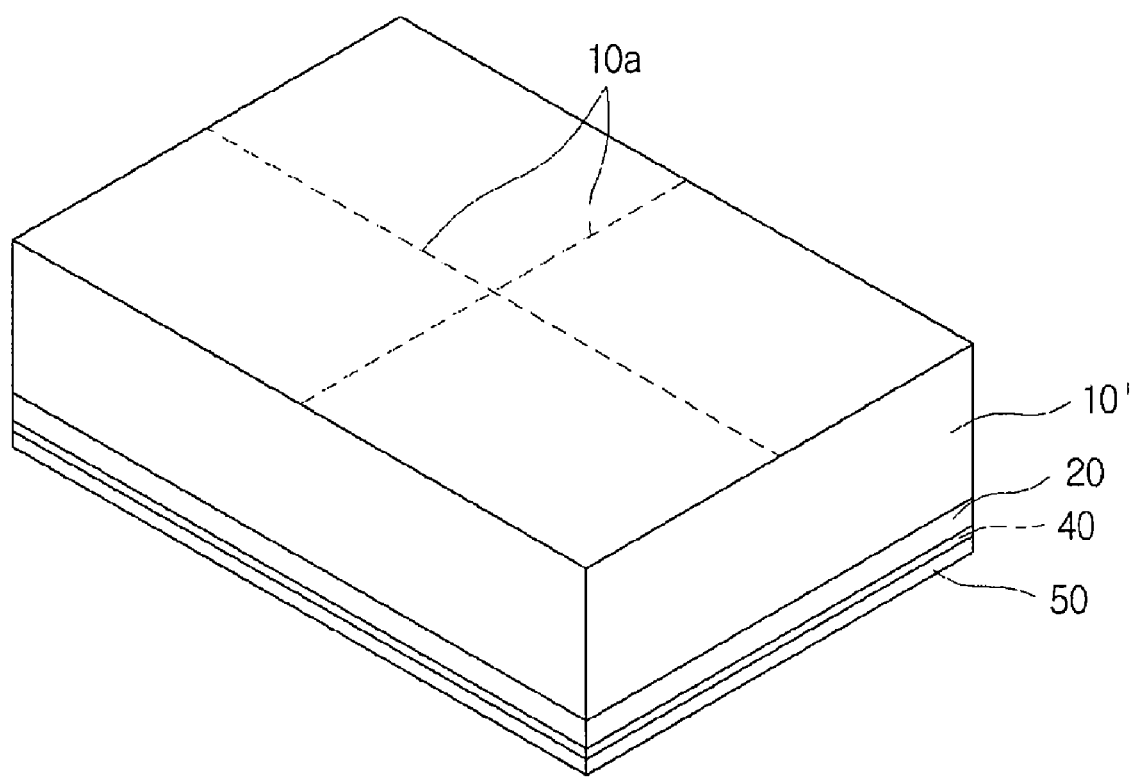
FIG. 5 is a perspective view illustrating how a semiconductor light emitting diode is divided based on an aspect of the invention.

This structure can be implemented using a process of forming division grooves 10a for dividing the semiconductor LED. In the illustration of FIG. 5, for example, the light emitting structure 20, 40, 50 can be grown over a bulk type substrate 10', and the division grooves 10a can be processed in the form of dotted lines in the substrate 10' using laser, etc., and then the substrate 10' and the light emitting structure 20, 40, 50 can be divided by applying pressure to the substrate 10'. The division groove 10a can be formed in the shape of a dotted line by moving the substrate 10' or the laser along a linear path while periodically turning the laser on and off.

Using the method described above, a smooth first region 12, 22, 42, 52 having low surface roughness can be formed at the portions of the substrate and light emitting structure where the division groove 10a was actually formed, whereas a rough second region 14, 24, 44, 54 having high surface roughness can be formed at the portions where the division groove was not actually formed.

A transparent electrode 60 can be formed on the P-type semiconductor layer 50. The transparent electrode 60 can be a transmissive layer of an oxide membrane and can be made from ITO, ZnO, $RuO_x$, $TiO_x$, $IrO_x$, etc. While it is not illustrated in the drawings, it shall be evident that the first and second regions having different surface roughness can also be formed on the sides of the transparent electrode 60.

A certain portion between the transparent electrode 60 and the N-type semiconductor layer, inclusive, can be removed by mesa etching, and the N-type electrode 30 can be formed on a part of the N-type semiconductor layer 20 exposed by the mesa etching and the P-type electrode 70 can be formed on the transparent electrode 60.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above can be found in the appended claims.

What is claimed is:

1. A semiconductor light emitting diode comprising a light emitting structure, the light emitting structure comprising an N-type semiconductor layer, an active layer, and a P-type semiconductor layer stacked together,
wherein a first region and a second region having different levels of surface roughness are repeatedly formed on at least one side surface of the light emitting structure, the side surface forming an outer circumference of the light emitting structure.

2. The semiconductor light emitting diode of claim 1, further comprising a substrate stacked on a lower surface of the N-type semiconductor layer, wherein the first region and the second region are formed repeatedly on at least one side of the substrate.

3. The semiconductor light emitting diode of claim 1, wherein the light emitting structure has a portion thereof removed by mesa etching between the P-type semiconductor layer and including a part of the N-type semiconductor layer.

4. The semiconductor light emitting diode of claim 1, wherein the first region and the second region are formed alternately on at least one side of the light emitting structure.

5. The semiconductor light emitting diode of claim 1, wherein the second region has a protrusion formed on at least one side of the light emitting structure.

6. The semiconductor light emitting diode of claim 5, wherein the first region is smoother than the second region.

7. The semiconductor light emitting diode of claim 1, wherein the first region and the second region are formed at regular intervals on at least one side of the light emitting structure.

8. The semiconductor light emitting diode of claim 2, wherein the first region on at least one side of the substrate and the first region on the light emitting structure are formed to be coplanar.

* * * * *